United States Patent [19]

Wise

[11] 4,355,272

[45] Oct. 19, 1982

[54] SHUTTER MECHANISM

[75] Inventor: Lawrence A. Wise, Sunnyvale, Calif.

[73] Assignee: Optimetrix Corporation, Mountain View, Calif.

[21] Appl. No.: 82,485

[22] Filed: Oct. 9, 1979

[51] Int. Cl.³ .............................................. G05B 5/01
[52] U.S. Cl. ................... 318/561; 318/616; 318/632
[58] Field of Search ............... 318/632, 616, 561, 571, 318/617, 618

[56] References Cited

U.S. PATENT DOCUMENTS

| | | | |
|---|---|---|---|
| 3,704,659 | 12/1972 | Low et al. ............................. | 95/59 |
| 3,906,326 | 9/1975 | Chur ............................. | 318/616 X |
| 4,088,938 | 5/1978 | Baker ............................. | 318/616 X |
| 4,103,314 | 7/1978 | Case ................................ | 318/571 |
| 4,143,310 | 3/1979 | Fujinawa et al. ................... | 318/571 |
| 4,168,457 | 9/1979 | Rose ................................ | 318/632 X |

FOREIGN PATENT DOCUMENTS 2140073 1/1973 France .
1478841 7/1977 United Kingdom .

Primary Examiner—B. Dobeck
Attorney, Agent, or Firm—Roland I. Griffin

[57] ABSTRACT

A shutter is rotatably mounted in a housing for opening and closing a shutter aperture in the housing. The shutter is coupled to a drive unit for unidirectionally rotating the shutter with the same velocity profile to open and close the shutter aperture during each exposure period. This drive unit includes a drive motor and a control circuit having a source of position and velocity reference data and a feedback control loop configurable for either position or velocity control of the shutter as determined by a control command.

12 Claims, 8 Drawing Figures

SHUTTER MECHANISM

BACKGROUND OF THE INVENTION

This invention relates generally to shutter mechanisms and, more particularly, to a rotary shutter mechanism for use in a photometric printing system.

Various shutter mechanisms are employed in photometric printing systems of the type used, for example, in the semiconductive industry to photometrically print an image of a photomask or a reticle on a semiconductor wafer by exposing selected regions of a photosensitive film on the semiconductive wafer to exposure light passing through the photomask or the reticle. In order to photometrically print this image on the semiconductive wafer with high resolution, it is very important to uniformly illuminate the photomask or the reticle and, hence, the selected regions of the photosensitive film on the semiconductive wafer with the exposure light. The shutter mechanisms conventionally employed in such photometric printing systems control the exposure period, but typically do not open all portions of the shutter aperture for the same length of time. Thus, the photomask or the reticle and, hence, the selected regions of the photosensitive film on the semiconductive wafer are therefore typically not uniformly illuminated with the exposure light. In addition to this important drawback, the shutter mechanisms conventionally employed in such photometric printing systems are typically larger and slower than desired for many photometric printing applications.

SUMMARY OF THE INVENTION

The foregoing drawbacks of shutter mechanisms conventionally employed in photometric printing systems may be overcome by employing a rotary shutter mechanism which, in accordance with the preferred embodiment of this invention, has a cylindrical housing with a conically-shaped shutter cover coaxially disposed and fixedly mounted at one end thereof. A conically-shaped shutter provided with a pair of matching diametrically-opposite openings in the side thereof is coaxially and rotatably mounted within the housing directly adjacent to the shutter cover. As the shutter rotates, it alternately opens and closes a circular shutter aperture provided in the shutter cover in direct alignment with the rotational path of the openings in the shutter. A drive unit is coaxially supported by the housing and is coupled to the shutter for unidirectionally rotating the shutter during each exposure period with the same velocity profile for opening and closing the shutter aperture so that all portions of the shutter aperture are open for the same length of time during each exposure period. Due to both the coaxial construction of the shutter mechanism and the conical shape of the shutter and the shutter cover, the size of the shutter mechanism may be reduced, thereby also reducing the moment of inertia and increasing the speed of the shuter mechanism.

In addition to the foregoing, the preferred embodiment of the present invention uses an improved control circuit for the shutter mechanism that provides both position control and velocity control. In previous velocity control circuits, the controlling (or command) reference input signal was typically a fixed or minimally adjustable signal which offered little flexibility with respect to many control applications. Furthermore, when running in both velocity and position control modes, previous control circuits offered compromised performance in accommodating both modes of operation. The improved control circuit of the present invention circumvents both of the above-mentioned drawbacks. The use of a controllable reference generator allows the user to select a velocity profile to precisely suit the performance requirements of the shutter mechanism. A feedback control loop, the topology of which may be altered under external control, delivers precise, consistant performance, whether operating in a position or a velocity control mode. When this feedback control loop and the controllable reference generator are combined and operated under the direction of a common controller, such as a computer, a high-performance control circuit is obtained with a minimized components count.

DESCRIPTION OF THE PREFERRED EMBODIMENT

Figure 1:
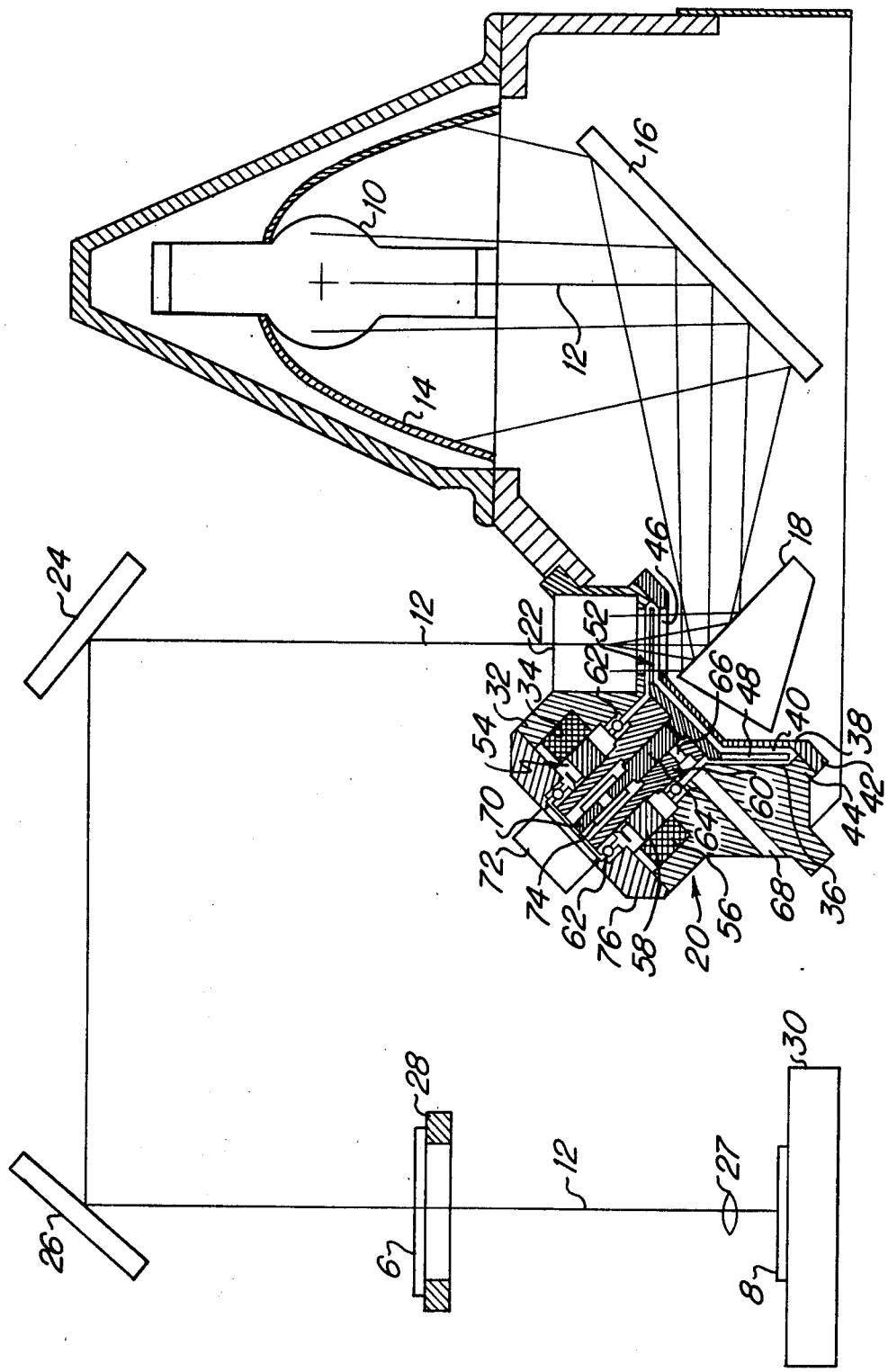
FIG. 1 is a sectional view of a portion of a photometric printing system incorporating a rotary shutter mechanism according to the preferred embodiment of this invention.

Referring to FIG. 1, there is shown a portion of a photometric printing system for photometrically printing an image of a photomask or a reticle 6 on a semiconductive wafer 8 by selectively exposing a photosensitive film on the semiconductive wafer to exposure light passing through the photomask or the reticle as shown and described, for example, in U.S. patent application Ser. No. 026,722 entitled, "Improved Step-and-Repeat Projection Alignment and Exposure System", filed on Apr. 3, 1979, by Edward H. Phillips, assigned to the same assignee as the present application, and incorporated herein by reference. The exposure light is emitted by a mercury arc lamp 10 fixedly mounted along a downwardly-extending portion of an optical path 12 of the photometric printing system. An elliptically-shaped reflector 14 surrounds mercury arc lamp 10 and is fixedly coaxially mounted therewith for projecting a beam of the exposure light emitted by the mercury arc lamp along the downwardly-extending portion of optical path 12 to a band reflecting plane mirror 16. This mirror is fixedly mounted in optical path 12 at an angle of forty-five degrees with respect to the downwardly-extending portion thereof so as to deflect the beam of exposure light along a laterally-extending portion of the optical path to a plane mirror 18.

Plane mirror 18 is fixedly mounted in optical path 12 at an angle of forty-five degrees with respect to the laterally-extending portion thereof so as to deflect the beam of exposure light along an upwardly-extending portion of the optical path to a rotary shutter mechanism 20 and, when the shutter mechanism is opened, there to a light integrator 22 fixedly mounted in the upwardly-extending portion of the optical path. Light integrator 22 is employed for providing the beam of exposure light passing therethrough with a uniform intensity distribution in the plane of the photomask or reticle 6 and is operable for doing so provided all portions of the input surface of the light integrator are exposed to the beam of exposure light for the same length of time. The photomask or reticle 6 is supported in optical path 12 at a location between the light integrator 22 and the semiconductive wafer 8 so that, when the rotary shutter mechanism 20 is opened, an image of the photomask or reticle may be photometrically printed on the semiconductive wafer by exposure of selected regions of the photosensitive film on the semiconductive wafer to the exposure light passing through the photomask or the reticle. Plane reflecting mirrors 24 and 26, lens 27, and other optics, as shown and described, for example, in U.S. patent application Ser. No. 026,722, may be employed for projecting the beam of exposure light from light integrator 22 along optical path 12 to the photomask or reticle 6 and, thence, to the semiconductive wafer 8. In addition, the photomask or reticle 6 and the semiconductive wafer 8 may be supported on relatively movable stages 28 and 30, as further shown, for example, in U.S. patent application Ser. No. 026,722, to facilitate alignment of the semiconductive wafer and the photomask or reticle before exposing the photosensitive film on the semiconductive wafer to the exposure light.

Figure 2A:
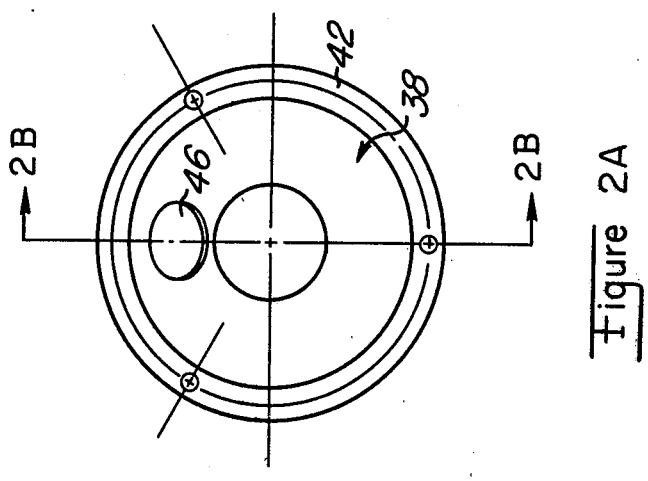
FIGS. 2A and 2B are bottom plan and sectional side views, respectively, of the shutter cover of the rotary shutter mechanism of FIG. 1.
Figure 2B:
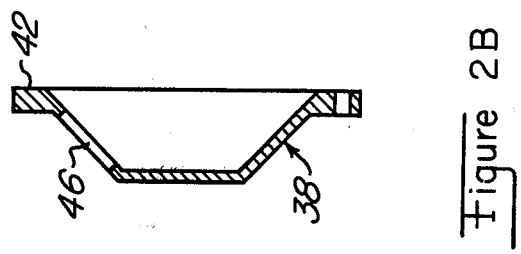

In accordance with the illustrated preferred embodiment of this invention, rotary shutter mechanism 20 has a cylindrical housing 32 with a cylindrical bore 34 having a conically-shaped end portion 36 of outwardly-increasing diameter. Referring now to FIGS. 1, 2A and 2B, a correspondingly conically-shaped shutter cover 38 of outwardly-increasing diameter is coaxially disposed in spaced relationship to the conically-shaped end portion 36 of housing 32 so as to provide a conically-shaped clearance space 40. The conically-shaped shutter cover 38 is fixedly held in place by securing an annular flange 42 thereof to a mating annular shoulder 44 of the conically-shaped end portion 36 of housing 32 with screws or the like. A circular shutter aperture 46 of sufficient size to permit passage of the beam of exposure light therethrough is formed in the side of the conically-shaped shutter cover 38 and in the adjacent portion of the housing 32. Rotary shutter mechanism 20 is fixedly mounted adjacent to the optical path 12 so that the shutter aperture 46 is disposed in direct alignment with the upwardly-extending portion of the optical path for receiving the beam of exposure light reflected therealong by plane mirror 18.

Figure 3A:
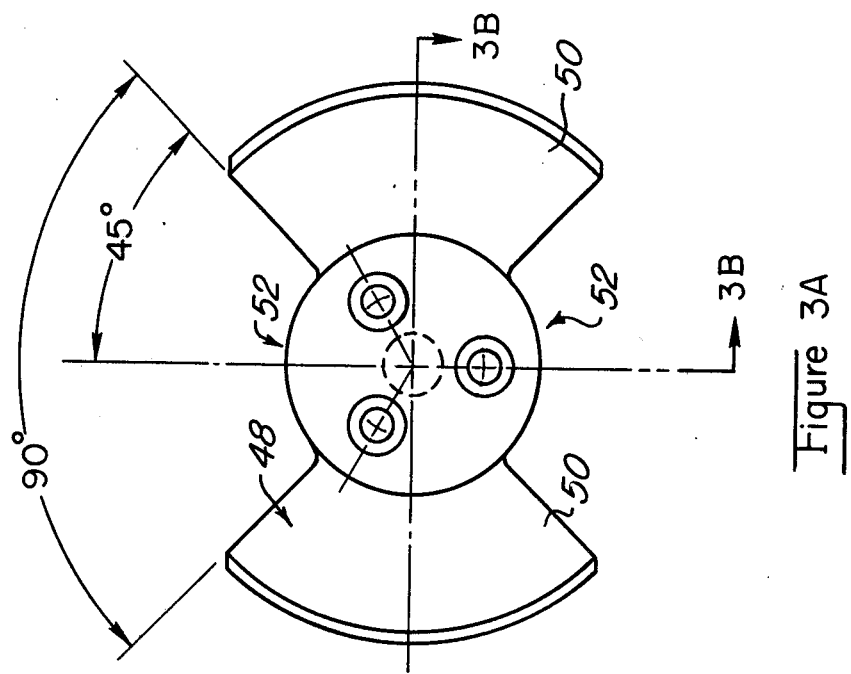
FIGS. 3A and 3B are bottom plan and sectional side views, respectively, of the shutter of the rotary shutter mechanism of FIG. 1.
Figure 3B:
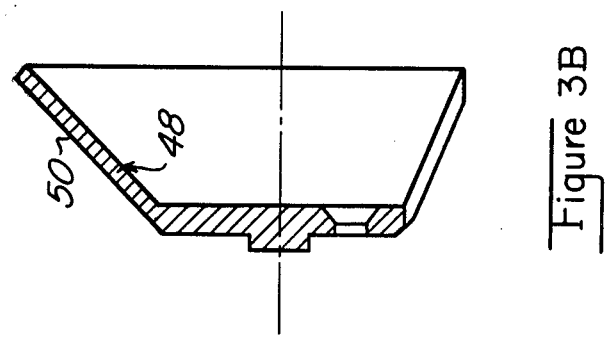

Referring now to FIGS. 1, 3A and 3B, there is coaxially and rotatably mounted within the conically-shaped clearance space 40 a correspondingly conically-shaped shutter 48 having a pair of matching diametrically-opposite side portions 50 each disposed for fully closing the shutter aperture 46 as the shutter rotates and an orthogonally-oriented pair of matching diametrically-opposite side openings 52, each disposed for fully opening the shutter aperture as the shutter rotates. Before the conically-shaped shutter cover 38 is actually secured in place, a cylindrically-shaped drive motor 54 (such as an Inland T-1342 DC torque motor manufactured and sold by the Inland Motor Division of the Kollmorgen Corporation) having a field magnet 56 and a rotor 58 is coaxially secured in place within the bore 34 of housing 32. A cylindrically-shaped hub 60 is inserted through an axial cylindrical bore of the rotor 58, affixed to the rotor, and coaxially supported within the bore 34 of housing 32 by bearings 62 for rotation with the rotor. The conically-shaped shutter 48 is fixedly secured to the hub 60 with screws or the like so as to rotate with the hub and within the conically-shaped clearance space 40. At this point the conically-shaped shutter cover 38 may be fixedly secured in place as described above.

A first shaft 64 is inserted within an axial cylindrical bore of hub 60 and affixed to the hub for rotation therewith by a set screw 66 that may be screwed into place through a clearance opening 68 provided for that purpose in housing 32. The first shaft 64 is coupled to a second shaft 70 of a potentiometer 72 by a bellows coupling 74 for accomodating any axial misalignment of the two shafts and for imparting rotation of the first shaft (and, hence, of the shutter 48) to the second shaft so that the potentiometer provides an output voltage proportional to the rotational position of the shutter. Potentiometer 72 is secured to a motor cover 76 which is coaxially secured in place at the non-conical end of housing 32 to seal off the cylindrical bore 34 of the housing and prevent dust or other foreign matter from impairing the operation of the drive motor 54.

Figure 4:
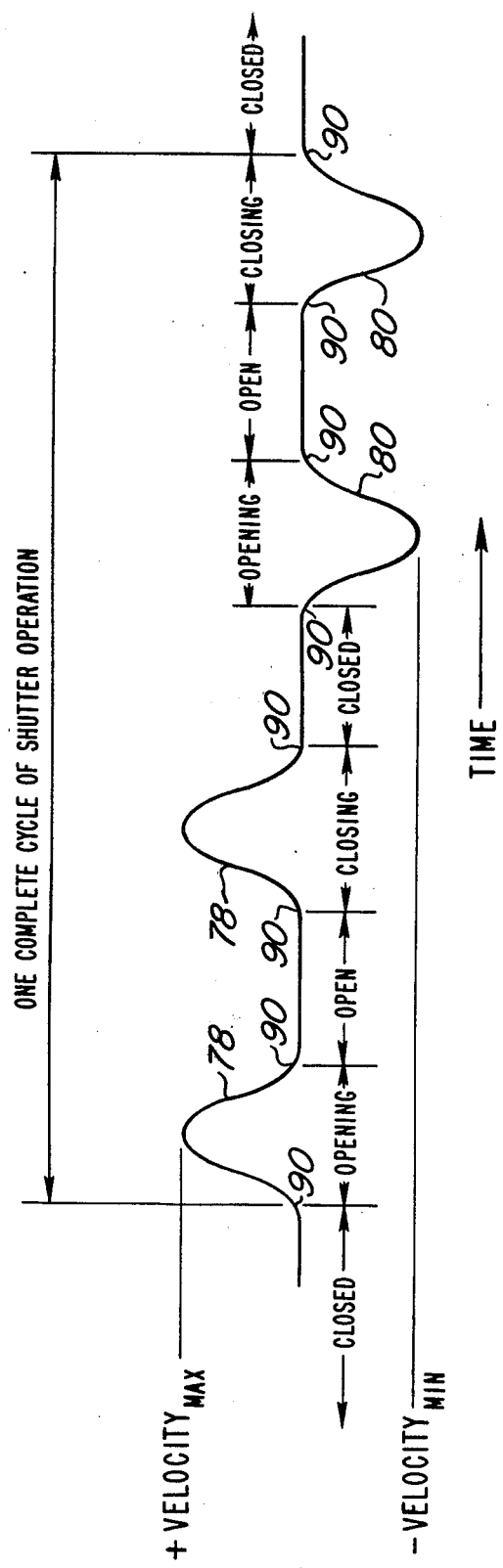
FIG. 4 is a waveform diagram illustrating the velocity profile of the shutter of FIGS. 3A and 3B for one complete cycle of shutter operation.

The potentiometer 72 is part of a control circuit, hereinafter described, electrically coupled to the drive motor 54 for controlling the shutter 48. This control circuit drives the drive motor 54 to unidirectionally rotate shutter 48 in one sense (for example, clockwise) with the same velocity profile 78 for both opening and closing the shutter aperture 46 during a first exposure period and to unidirectionally rotate the shutter in the opposite sense (for example, counter-clockwise) with the same velocity profile 80 for both opening and closing the shutter aperture during a second exposure period, as indicated in FIG. 4 for one complete cycle of shutter operation. Thus, all portions of the shutter aperture 46 are open for the same length of time during each exposure period. This results in all portions of the input surface of the light integrator 22 being exposed to the beam of exposure light through the shutter aperture 46 of rotary shutter mechanism 20 for the same length of time during each exposure period and, hence, in substantially uniform illumination of the photomask or reticle 6 and of the selected regions of the photosensitive film on the semiconductive wafer 8 with exposure light, as required to photometrically print an image of the photomask or the reticle on the semiconductive wafer with high resolution.

Figure 5:
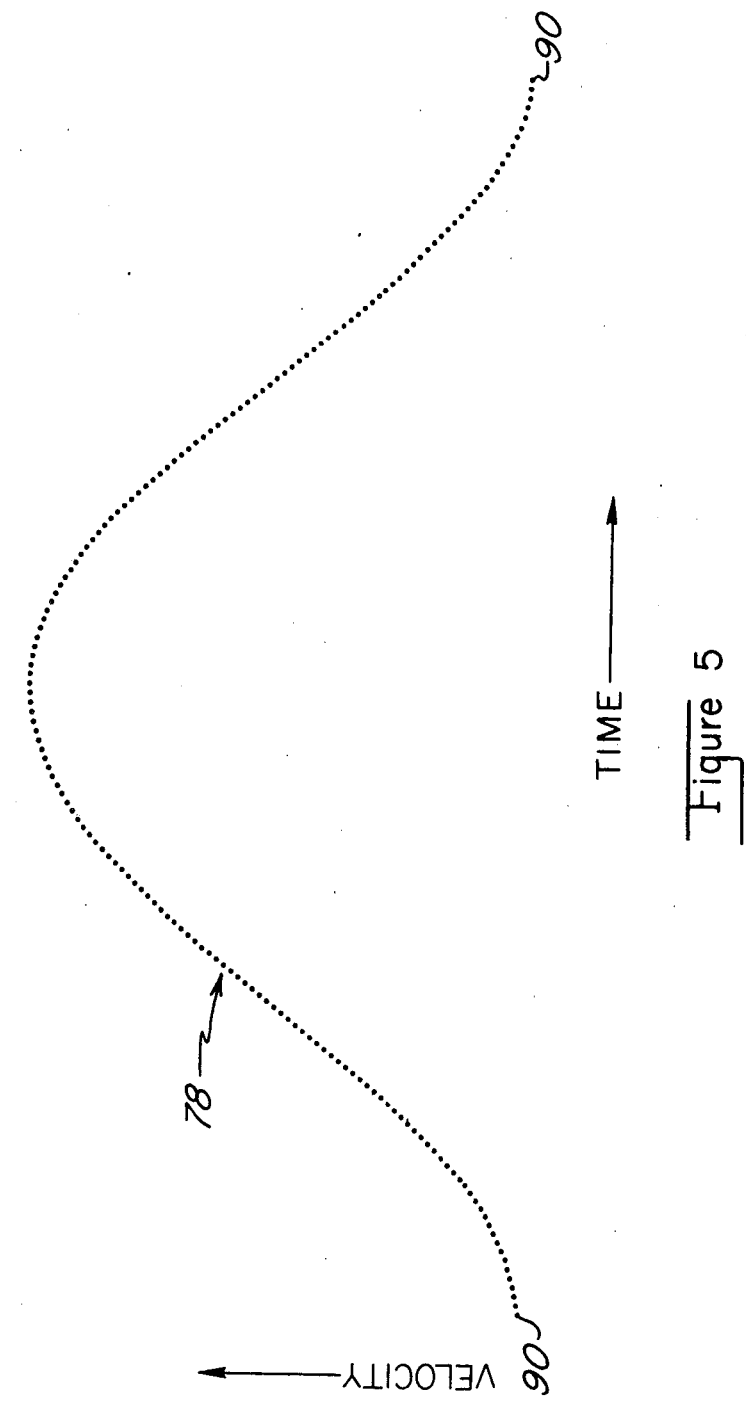
FIG. 5 is a detailed graph of a portion of the velocity profile of FIG. 4.

Since, as shown in FIG. 4, the velocity profile 78 or 80 for rotating the shutter 48 to open the shutter aperture 46 is the same as the velocity profile 78 or 80 for rotating the shutter to close the shutter aperture during each exposure period, except that the velocity profile 78 for the first exposure period and the velocity profile 80 for the second exposure period are of opposite polarity, a detailed graph of only the velocity profile 78 for rotating the shutter to open the shutter aperture is shown in FIG. 5. Each point on this graph represents a velocity datum stored, for example, in a computer 82 of the control circuit (see FIG. 6) and supplied by the computer at the designated time intervals to generate a precise velocity profile with an optimized contour for controlling the position of the shutter 48 as well as an optimized contour for controlling the velocity of the shutter.

Figure 6:
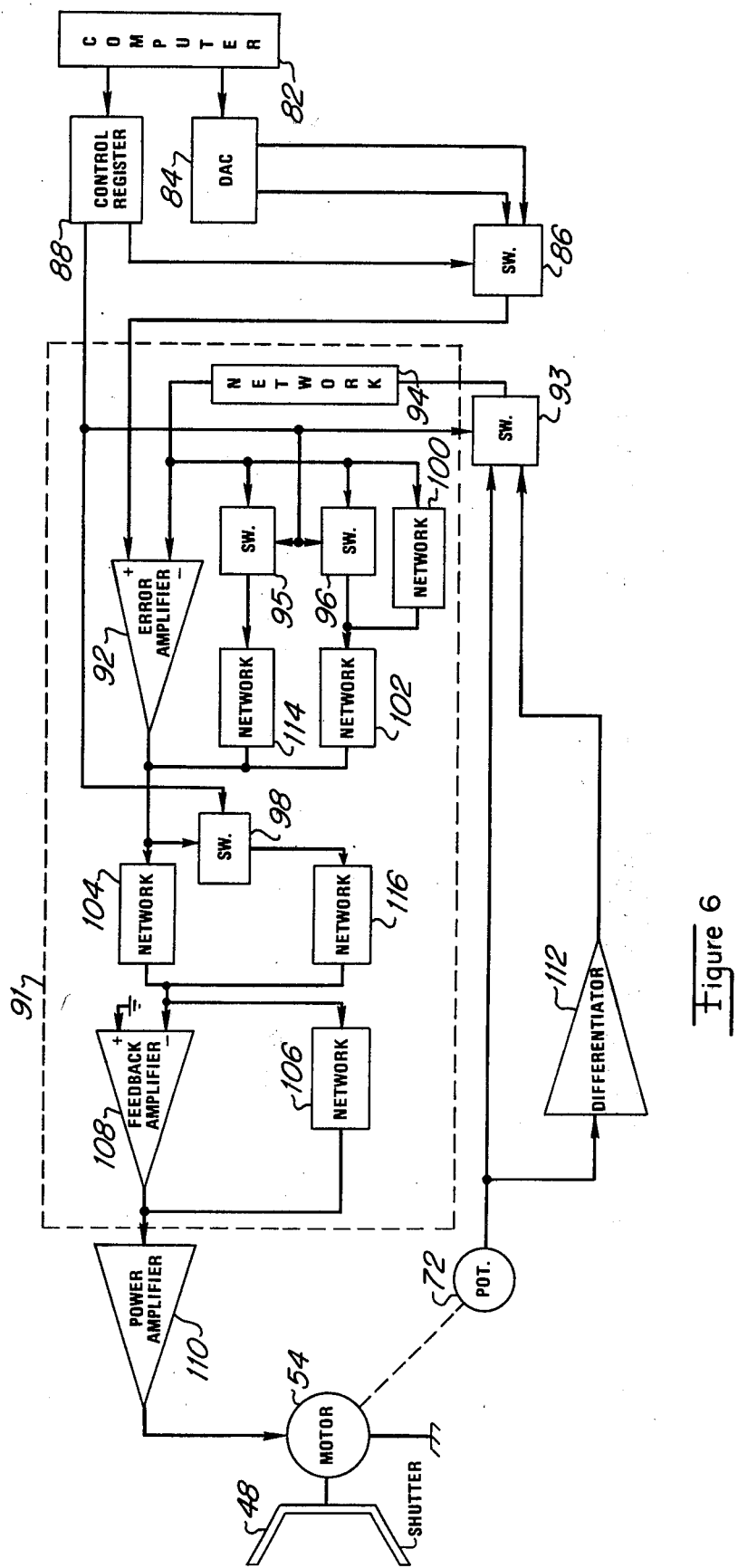
FIG. 6 is a block diagram of the drive unit, including a drive motor and an improved control circuit according to the preferred embodiment of this invention, for driving the rotary shutter mechanism of FIG. 1.

Referring now particularly to FIGS. 1, 5 and 6, each velocity datum stored in computer 82 is supplied as an eight-bit byte to a digital-to-analog converter 84 at the designated time interval (for example, one byte every five hundred microseconds). The digital-to-analog converter 84 converts each such byte to an analog velocity reference voltage and applies that analog velocity reference voltage along with a corresponding analog velocity reference voltage of opposite polarity to a single-pole double-throw switch 86. Computer 82 also supplies a two-bit control byte to a control register 88 at each transition 90 (see FIG. 4) between position and velocity control to configure a feedback control loop 91 of the control circuit as required for the following period of position or velocity control and as further explained in detail below.

Assuming the shutter 48 is initially closed, as at the beginning of the first exposure period of each complete cycle of shutter operation, control register 88 sets switch 86 to apply the noninverted analog velocity reference voltage to the positive input of an error amplifier 92 and sets a single-pole double-throw switch 93 to apply an analog velocity feedback voltage signal from a differentiator 112 through a resistive-capacitive lead network 94 to the negative input of the error amplifier. Concomitantly, control register 88 opens single-pole single-throw switches 95, 96 and 98 to configure feedback control loop 91 of the control circuit for velocity feedback. When so configured a capacitive network 100 and resistive networks 102, 104, and 106 are operatively included in the feedback control loop 91. This arrangement of networks provides the feedback control loop 91 with an optimum gain-frequency contour for velocity control. The feedback control loop 91 includes a feedback amplifier 108 having its negative terminal connected to the junction of resistive networks 104 and 106 and having its positive terminal connected to ground. This feedback amplifier 108 provides a stage of amplification of the error signal from error amplifier 92. A power amplifier 110 is coupled to the output of feedback amplifier 108 to further amplify the error signal and to supply the power required to drive the drive motor 54 so as to rotate the shutter 48 in accordance with the velocity profile of FIG. 5.

As indicated above, the potentiometer 72 is directly coupled to both the shutter 48 and the drive motor 54 so that the output voltage of the potentiometer is directly proportional to the rotational position of the shutter 48. The output voltage of the potentiometer 72 is differentiated by the differentiator 112 to yield the required analog velocity feedback voltage signal applied to switch 93 so as to close the feedback control loop 91 as configured for velocity control.

At the end of each period of velocity control, the shutter 48 is stationary and the feedback control loop 91 is switched to a position control configuration so as to insure that the next period of velocity control is started at the correct point. The computer 82 therefore supplies the digital-to-analog converter 84 with an eight-bit byte containing desired position information and supplies the control register 88 with a two-bit byte for switching the feedback control loop 91 to the position control configuration at the end of the above-described velocity control period. This causes the control register 88 to close switches 95, 96 and 98, to set the switch 86 for applying an analog position reference signal from the digital-to-analog converter 84 to the positive input of the error amplifier 92, and to set the switch 93 for directly applying the output voltage of the potentiometer 72 through the resistive-capacitive lead network 94 to the negative input of the error amplifier. With switches 95 and 96 closed, resistive network 102 and another resistive network 114 are operatively connected in parallel in the portion of feedback control loop 91 associated with the error amplifier 92. This yields a resistive feedback characteristic for the error amplifier 92. With switch 98 closed, a resistive-capacitive network 116 is operatively connected in parallel with resistive network 104 in the position of the fleedback control loop 91 associated with the feedback amplifier 108 to further increase the stability of the feedback loop as configured for position control.

I claim:

1. A servo-control circuit for controlling both velocity and position of a utilization device, said circuit comprising:

drive means for moving the utilization device;

a reference source of velocity and position reference information indicative of the desired velocity and position of the utilization device;

a feedback source of velocity and position feedback information indicative of the actual velocity and position of the utilization device;

a feedback control loop coupled to the drive means and to the reference and feedback sources, said feedback control loop having a topology configurable for velocity control of the drive means to control the velocity of the utilization device in accordance with velocity reference and feedback information from the reference and feedback sources and differently configurable for position control of the drive means to control the position of the utilization device in accordance with position reference and feedback information from the reference and feedback sources; and control means, coupled to the feedback control loop, for configuring the topology of the feedback control loop for velocity control of the drive means in response to a command signal and for differently configuring the topology of the feedback control loop for position control of the drive means in response to another command signal.

2. A servo-control circuit as in claim 1 wherein said feedback control loop comprises:

amplifying means, coupled to the drive means and to the reference and feedback sources, for supplying the drive means with an error signal related to the difference between the velocity reference and feedback information when the topology of the feedback control loop is configured for velocity control of the drive means and related to the difference between the position reference and feedback information when the topology of the feedback control loop is configured for position control of the drive means; and network means, coupled in circuit with the amplifying means, for determining the gain-frequency contour of the feedback control loop, said network means including switching means for modifying the gain-frequency contour of the feedback control loop in response to one of the aforementioned command signals.

3. A servo-control circuit as in claim 2 wherein:
said amplifying means comprises a first amplifier having first and second inputs coupled to the reference and feedback sources, respectively, and a second amplifier having an input connected in series with an output of the first amplifier and having an output coupled to the drive means;
said network means includes first network means for forming a feedback path from one of the first and second inputs to the output of the first amplifier, and second network means for coupling the output of the first amplifier to the aforementioned input of the second amplifier; and
said switching means includes first and second switching means included in said first and second network means, respectively, for modifying the gain-frequency contour of the feedback control loop in response to said one of the command signals.

4. A servo-control circuit as in claim 3 wherein:
said first network means comprises a first pair of networks coupled in parallel from said one of the first and second inputs to the output of the first amplifier;
said second network means comprises a second pair of networks coupled in parallel from the output of the first amplifier to the aforementioned input of the second amplifier;
said first switching means comprises a switch, connected in series with one of the first pair of networks from said one of the first and second inputs to the output of the first amplifier, for being opened or closed in response to said one of the command signals; and
said second switching means comprises a switch, connected in series with one of the second pair of networks from the output of the first amplifier to the aforementioned input of the second amplifier, for being opened or closed in response to said one of the command signals.

5. A servo-control circuit as in claim 4 wherein:
said first network means further comprises an additional network connected in series with the other of the first pair of networks from said one of the first and second inputs to the output of the first amplifier; and
said first switching means further comprises an additional switch, connected in parallel with the additional network, for being opened or closed in response to said one of the command signals.

6. A servo-control circuit as in any of the preceding claims 1–5 wherein said reference source comprises:
processing means for storing and selectively providing the velocity and position reference information in a first form compatible with the processing means;
conversion means, coupled to the processing means and to the feedback control loop, for converting the velocity and position reference information from the processing means to a second form compatible with the feedback control loop; and
means for coupling the conversion means to the feedback control loop to supply the converted velocity and position reference information from the conversion means to the feedback control loop.

7. A servo-control circuit as in claim 6 wherein:
said processing means comprises a computer for storing and providing the velocity and position reference information in a digital form; and
said conversion means comprises a digital-to-analog converter for converting the digital velocity and position reference information from the computer to analog velocity and position reference information for the feedback control loop.

8. A servo-control circuit as in claim 6 wherein said feedback source comprises:
first feedback source means for monitoring the position of the utilization device;
second feedback source means for monitoring the velocity of the utilization device; and
means for coupling the first and second feedback source means to the feedback control loop to supply the velocity and position feedback information from the first and second feedback source means to the feedback control loop.

9. A servo-control circuit as in claim 8 wherein:
said first feedback source means comprises a potentiometer for producing a signal indicative of the actual position of the utilization device; and
said second feedback source means comprises the potentiometer and a differentiator for producing a signal indicative of the actual velocity of the utilization device.

10. A servo-control circuit as in claim 8 wherein said control means comprises:
processing means for selectively providing the command signals; and
register means, coupled to the processing means and to the feedback control loop, for receiving the command signals from the processing means to configure the topology of the feedback control loop for velocity control of the drive means in response to the first-mentioned command signal and to differently configure the topology of the feedback control loop for position control of the drive means in response to the second-mentioned command signal.

11. A servo-control circuit as in claim 10 wherein the register means is also coupled to the reference and feedback sources for selectively controlling the application of reference and feedback information from those sources to the feedback control loop.

12. A servo-control circuit as in claim 10 wherein:
said drive means comprises a motor; and
said utilization device comprises a shutter.

* * * * *